(12) United States Patent
Jiang et al.

(10) Patent No.: US 12,405,134 B2
(45) Date of Patent: Sep. 2, 2025

(54) ELECTRONIC SEAL LABEL APPARATUS, ELECTRIC MOTOR ASSEMBLY AND ELECTRONIC SEAL LABEL VERIFICATION METHOD

(71) Applicant: Siemens Aktiengesellschaft, Munich (DE)

(72) Inventors: Kai Jiang, Nanjing (CN); Yao Sun, Nanjing (CN)

(73) Assignee: Siemens Aktiengesellschaft, Munich (DE)

( * ) Notice: Subject to any disclaimer, the term of this patent is extended or adjusted under 35 U.S.C. 154(b) by 1113 days.

(21) Appl. No.: 17/254,889

(22) PCT Filed: Jun. 28, 2018

(86) PCT No.: PCT/CN2018/093460
§ 371 (c)(1),
(2) Date: Dec. 22, 2020

(87) PCT Pub. No.: WO2020/000321
PCT Pub. Date: Jan. 2, 2020

(65) Prior Publication Data
US 2021/0207978 A1 Jul. 8, 2021

(51) Int. Cl.
*G01D 5/244* (2006.01)
*G01B 7/04* (2006.01)
*H02K 11/215* (2016.01)

(52) U.S. Cl.
CPC .............. *G01D 5/244* (2013.01); *G01B 7/04* (2013.01); *H02K 11/215* (2016.01)

(58) Field of Classification Search
CPC ................................ H02K 11/215; G01B 7/04
See application file for complete search history.

(56) References Cited

U.S. PATENT DOCUMENTS 5,072,181 A * 12/1991 Burger ............... G01D 5/34738
324/207.2
5,332,895 A * 7/1994 Rieder ................. G01D 5/2455
250/237 G (Continued)

FOREIGN PATENT DOCUMENTS

CN 103794023 A 5/2014
CN 105673922 A 6/2016

(Continued)

OTHER PUBLICATIONS

Wiegand Sensors (six pages) (Year: 2019).*

(Continued)

*Primary Examiner* — Paresh Patel
(74) *Attorney, Agent, or Firm* — Harness, Dickey & Pierce, P.L.C.

(57) ABSTRACT

Provided are an electronic seal label apparatus, an electric motor assembly with the electronic seal label apparatus, and an electronic seal label verification method. The electronic seal label apparatus includes: a magnet configured on a first component; and a sensing element configured on a second component and fixed opposite the magnet. When relative motion takes place between the first component and the second component, the sensing element generates a first signal according to the Wiegand effect, so that a disassembly or assembly state between the first component and the second component, which can be removed from each other, can be detected automatically.

17 Claims, 5 Drawing Sheets

(56) References Cited

U.S. PATENT DOCUMENTS

| | | | | |
|---|---|---|---|---|
| 6,084,400 | A | * | 7/2000 | Steinich ................ G01P 3/4815 |
| | | | | 324/207.13 |
| 2009/0039872 | A1 | * | 2/2009 | Fischer ................. G01D 5/145 |
| | | | | 324/207.13 |
| 2010/0050455 | A1 | * | 3/2010 | Siraky ................. G01D 5/2457 |
| | | | | 33/708 |
| 2013/0057263 | A1 | | 3/2013 | Hosek |
| 2015/0153203 | A1 | | 6/2015 | Simon et al. |

FOREIGN PATENT DOCUMENTS

| | | | |
|---|---|---|---|
| CN | 105759701 A | | 7/2016 |
| CN | 107016304 A | | 8/2017 |
| DE | 19637388 A1 | | 3/1998 |
| DE | 19634626 C1 | | 6/1998 |
| DE | 19933568 A1 | | 2/2001 |
| DE | 102008048780 A1 | | 4/2010 |
| EP | 0542088 A1 | | 5/1993 |
| EP | 3382857 A1 * | 10/2018 | ........... H02K 11/215 |
| FR | 2588076 A * | 4/1987 | ............... G01B 7/02 |
| GB | 2066883 A * | 7/1981 | ............. E05B 47/00 |
| GB | 2071334 A * | 9/1981 | ............. H03K 17/97 |
| GB | 2071335 A * | 9/1981 | ............. H03K 17/97 |
| GB | 2071336 A * | 9/1981 | ............. G01D 5/204 |
| GB | 2071337 A * | 9/1981 | ............... G01D 5/14 |
| GB | 2073428 A * | 10/1981 | ............ G01P 3/4815 |
| GB | 2074390 A * | 10/1981 | ........... H03K 17/723 |
| JP | 2018036138 A | | 3/2018 |
| JP | 2018054489 A | | 4/2018 |

OTHER PUBLICATIONS

Translation of EP-3382857-A1 (Year: 2018).*
Translation of FR-2588076-A1 (Year: 1987).*
Translation of DE 196 34 626 C1 (Year: 1998).*
International Search Report PCT/ISA/210 for International Application No. PCT/CN2018/093460 dated Mar. 28, 2019.
Written Opinion PCT/ISA/2137 for International Application No. PCT/CN2018/093460 dated Mar. 28, 2019.

* cited by examiner

ELECTRONIC SEAL LABEL APPARATUS, ELECTRIC MOTOR ASSEMBLY AND ELECTRONIC SEAL LABEL VERIFICATION METHOD

PRIORITY STATEMENT

This application is the national phase under 35 U.S.C. § 371 of PCT International Application No. PCT/CN2018/093460, which has an International filing date of Jun. 28, 2018, which designated the United States of America, the entire contents of which are hereby incorporated herein by reference.

FIELD

Embodiments of the present application generally relate to the field of security protection, in particular to electronic sealing label technology.

BACKGROUND

In order to prevent non-professionals from disassembling or dismantling various types of instrument apparatus, especially precision apparatuses, a sealing label device will often be provided on the instrument apparatus; in general, the sealing label device is arranged in an adjustable position on the instrument apparatus. At present, existing sealing label devices generally lack an automatic detection function; a person performing a check must use the naked eye for identification, to determine whether a sealed instrument apparatus has been dismantled; the error rate is high and efficiency is low. If an instrument apparatus that has been dismantled is put into service, there is a strong possibility that it will suffer a drop in performance or even damage as a result. To avoid these problems, there is an urgent need in the art for a better solution to eliminate these problems.

Moreover, in the field of industrial drive for example, an encoder is arranged at one side of an electric machine, and recorded electric machine running information is transmitted to a driver. For the sake of electric machine precision, some specific compensation data of each electric machine will be stored in the encoder arranged thereon, therefore it is necessary to ensure matching between the electric machine and encoder. If the encoder is replaced at will, this might result in the compensation data of the new encoder being mismatched with the original electric machine, such that the electric machine performance is degraded. Thus, it is necessary that the abovementioned sealing label device be used for this kind of electric machine and encoder to monitor a disassembly/assembly state of both. However, due to the structural characteristics of electric machines and encoders, there will be special requirements for sealing label devices in such applications.

SUMMARY

At least one embodiment of the present invention realizes an automatic detection function, to increase the security and service life of the entire system, and effectively avoid problems such as a drop in performance or even damage during use of an instrument apparatus that has been dismantled. Moreover, at least one embodiment of the present invention does not require any major changes to the structural design of an existing instrument apparatus, so is a low-cost improvement, and has good application prospects.

According to one embodiment of the present invention, an electronic sealing label device is provided, suitable for detecting a disassembly/assembly state between a first component and a second component that can be removed from each other, characterized in that the electronic sealing label device comprises: a magnet, arranged on the first component; and a sensing element, the sensing element being arranged on the second component and fixed in a position opposite the magnet, wherein the sensing element exploits the Wiegand effect to generate a signal when relative movement occurs between the first component and second component, thereby realizing automatic detection.

According to another embodiment of the present invention, an electric machine assembly is provided, characterized in that the electric machine assembly comprises: an electric machine housing, an encoder and an electronic sealing label device, the encoder being arranged in the electric machine housing, and the electronic sealing label device comprising: a magnet, arranged on the electric machine housing; and a sensing element, the sensing element being arranged on the encoder and fixed in a position opposite the magnet, wherein the sensing element exploits the Wiegand effect to generate a signal when relative movement occurs between the electric machine housing and the encoder.

According to another embodiment of the present invention, an electronic sealing label verification method is provided, suitable for an assembly comprising an electronic sealing label device and a first component and a second component that can be removed from each other, characterized by comprising the following steps: S1: when the assembly is started, reading sign information in a signal recording module, wherein, when relative movement occurs between the first component and second component, the electronic sealing label device exploits the Wiegand effect to generate a signal, and changes the sign information in the signal recording module according to the signal; S2: determining whether the first component and second component have been removed according to the sign information; and S3: if it is determined that removal has occurred, stopping the operation of the first component and/or the second component. Automatic detection is realized, and operation is stopped immediately upon discovering that removal has occurred, thus improving system security.

BRIEF DESCRIPTION OF THE DRAWINGS

The drawings are included to provide further understanding of the present invention; they are recorded and form part of the present application. The drawings show embodiments of the present invention, and together with this description serve to explain the principles of the present invention. In the drawings.

KEY TO REFERENCE LABELS 1 electric machine housing
2 encoder
3 driver
10 electronic sealing label device
20 control device
12 magnet
14 sensing element
16 information recording module
162 ferroelectric memory
164 amplification circuit
166 filter circuit

DETAILED DESCRIPTION OF THE EXAMPLE EMBODIMENTS

According to one embodiment of the present invention, an electronic sealing label device is provided, suitable for detecting a disassembly/assembly state between a first component and a second component that can be removed from each other, characterized in that the electronic sealing label device comprises: a magnet, arranged on the first component; and a sensing element, the sensing element being arranged on the second component and fixed in a position opposite the magnet, wherein the sensing element exploits the Wiegand effect to generate a signal when relative movement occurs between the first component and second component, thereby realizing automatic detection.

According to one embodiment, in the electronic sealing label device, the sensing element is an inductive coil, and the signal is an electric signal pulse. The inductive coil is a magnetically sensitive sensor; when in a magnetic field, the inductive coil cuts magnetic induction lines to generate an induced voltage, with high sensitivity.

According to one embodiment, in the electronic sealing label device, the sensing element is a Wiegand sensor. During operation, the Wiegand sensor does not need an external power supply, and has high operating stability, having relatively low requirements with regard to distance and temperature of the environment of use, etc.

According to one embodiment, in the electronic sealing label device, the distance between the sensing element and the magnet is less than or equal to a preset distance, to ensure normal operation of the sensing element.

According to one embodiment, the electronic sealing label device further comprises: a signal recording module, adapted to receive the signal, and generate and record sign information according to the signal.

According to one embodiment, in the electronic sealing label device, the information recording module comprises: a ferroelectric memory, wherein the ferroelectric memory changes a sign data bit thereof according to the signal in order to record the sign information. The ferroelectric memory is capable of performing storage rapidly with a very low electric energy demand, and has non-volatile storage characteristics.

According to one embodiment, in the electronic sealing label device, the signal recording module further comprises: an amplification circuit and/or filter circuit, connected between the sensing element and the ferroelectric memory, thereby enhancing the ability of the electronic sealing label device to withstand interference.

According to another embodiment of the present invention, an electric machine assembly is provided, characterized in that the electric machine assembly comprises: an electric machine housing, an encoder and an electronic sealing label device, the encoder being arranged in the electric machine housing, and the electronic sealing label device comprising: a magnet, arranged on the electric machine housing; and a sensing element, the sensing element being arranged on the encoder and fixed in a position opposite the magnet, wherein the sensing element exploits the Wiegand effect to generate a signal when relative movement occurs between the electric machine housing and the encoder.

According to one embodiment, in the electric machine assembly, the electronic sealing label device comprises: a signal recording module, adapted to receive the signal, and generate and record sign information according to the signal, wherein the signal recording module is arranged on the encoder.

According to one embodiment, the electric machine assembly further comprises: a control device, arranged on the encoder, wherein the control device generates disassembly/assembly state information of the encoder according to the sign information.

According to one embodiment, the electric machine assembly further comprises: a driver, wherein the driver controls the startup/shutdown of an electric machine in the electric machine assembly according to the disassembly/assembly state information of the control device.

According to one embodiment, in the electric machine assembly, the electronic sealing label device comprises two magnets, installed on the electric machine housing in two directions, specifically axial and radial directions of the electric machine housing respectively; and two sensing elements, arranged in directions corresponding to the two magnets respectively, are provided inside the encoder.

According to one embodiment, in the electric machine assembly, the electronic sealing label device comprises one magnet and one sensing element; the magnet is installed on the electric machine housing in an axial 45-degree direction of the electric machine housing; one sensing element, arranged in a direction corresponding to the magnet, is provided inside the encoder.

According to another embodiment of the present invention, an electronic sealing label verification method is provided, suitable for an assembly comprising an electronic sealing label device and a first component and a second component that can be removed from each other, characterized by comprising the following steps: S1: when the assembly is started, reading sign information in a signal recording module, wherein, when relative movement occurs between the first component and second component, the electronic sealing label device exploits the Wiegand effect to generate a signal, and changes the sign information in the signal recording module according to the signal; S2: determining whether the first component and second component have been removed according to the sign information; and S3: if it is determined that removal has occurred, stopping the operation of the first component and/or the second component. Automatic detection is realized, and operation is stopped immediately upon discovering that removal has occurred, thus improving system security.

According to one embodiment, in the electronic sealing label verification method, after the step of stopping the operation of the first component and/or the second component, the method further comprises: S4: resetting the sign information in the signal recording module; and S5: when restarting the assembly, performing steps S1-S3 again, wherein step S4 is performed after reassembling and configuring the first component and second component. An initialization operation can be realized automatically each time installation is performed, thus improving efficiency.

According to one embodiment, in the electronic sealing label verification method, step S3 further comprises: generating an alarm signal at the same time as stopping the operation of the first component and/or the second component. If the first component and second component have been removed from each other, a warning prompt is issued to a user, thus improving system security.

According to one embodiment, in the electronic sealing label verification method, the first component is an electric machine and the second component is an encoder, wherein step S3 further comprises: if it is determined that removal has occurred, only stopping the operation of the electric machine.

It should be understood that the above general description and the following detailed description of the present invention are both example and illustrative, and intended to provide further explanation of the present invention as described in the claims.

Embodiments of the present invention are now described, making detailed reference to the drawings. Preferred embodiments of the present invention are now referred to in detail; examples thereof are shown in the drawings. Wherever possible, identical labels are used to denote identical or similar parts in all of the drawings. Moreover, although the terms used in the present invention are selected from well known terms in common use, some terms mentioned herein might be selected by the applicant according to his or her judgment; the detailed meanings thereof are explained in the relevant parts of the description herein. Furthermore, it is necessary that the present invention be understood not just through the actual terms used, but also through the meaning contained in each term.

The basic principles and preferred embodiments of the present invention are discussed in greater detail with reference to FIG. 1.

Figure 1:
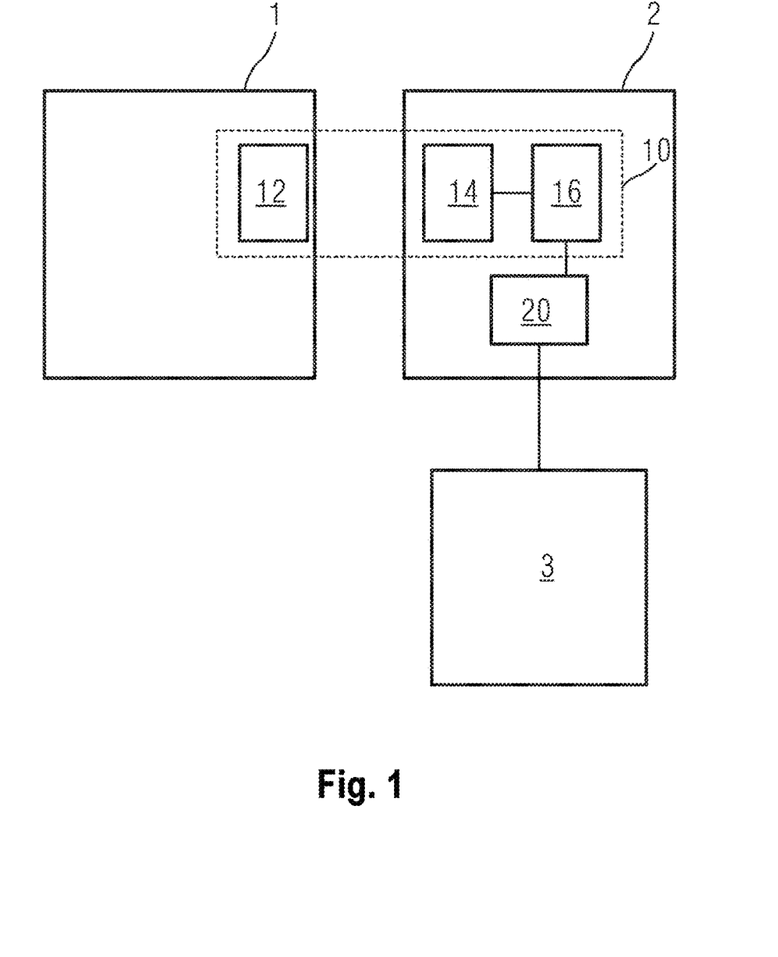
FIG. 1 shows a schematic diagram of an electronic sealing label device according to an embodiment of the present invention.

Taking FIG. 1 as an example, an electronic sealing label device 10 according to the present invention mainly comprises a magnet 12 and a sensing element 14, the magnet 12 being arranged on a first component, and the sensing element 14 being arranged on a second component, wherein the first component and second component can be removed from one another. The relative positions of the magnet 12 and sensing element 14 are fixed; that is, in a normal state of the first component and second component, the magnet 12 and sensing element 14 are both located in correct installation positions, but when relative movement occurs between the first component and second component due to dismantling or some other reason, causing the magnet 12 or sensing element 14 to deviate from the correct position, the sensing element 14 can exploit the Wiegand effect to generate a signal, i.e. the electronic sealing label device can detect a disassembly/assembly state between the first component and second component.

The electronic sealing label device 10 may further comprise a signal recording module 16; the signal recording module 16 is connected to the sensing element 14, receives a signal from the sensing element 14, and generates and records sign information according to the signal. The signal recording module 16 may further be connected to a control device 20; the control device 20 may control an operating state of the first component and second component according to the sign information, to prevent the normal use of an instrument apparatus that has been illegally dismantled and interfered with.

The sensing element 14 may be for example an inductive coil, which will generate an electric signal pulse when moving in the magnetic field of the magnet 12. The inductive coil is a magnetically sensitive sensor; when in the magnetic field, the inductive coil cuts the magnetic induction lines to generate an induced voltage, with high sensitivity. Moreover, according to another embodiment, the sensing element 14 may be for example a Wiegand sensor. A Wiegand sensor is composed of a specially processed magnetically bistable functional alloy wire (sensitive wire) and an inductive coil wound outside the wire. When a magnetic field of a particular polarity (e.g. N pole) parallel to the sensitive wire attains an intensity which triggers magnetic induction, magnetic domains in the sensitive wire are excited and will move, with the magnetization directions instantaneously turning to the same direction; at the same time, the magnetic field in the space around the sensitive wire also undergoes an instantaneous change, and an electric pulse is thereby induced in the inductive coil. During operation, the Wiegand sensor does not need an external power supply, being able to output a voltage of 3-5 V, and can drive a microprocessor directly; furthermore, the Wiegand sensor has relatively low requirements with regard to the temperature of the environment of use, having an operating temperature range as wide as $-196°$ C. to $+300°$ C. In general, in order to ensure the operating stability of the sensing element 14, it is necessary to put the sensing element 14 in a certain magnetic field strength; thus, to ensure the magnetic field strength, the distance between the sensing element 14 and the magnet 12 is less than or equal to a preset distance. For example, in one embodiment, the distance between the magnet 12 and the sensing element is not less than 15 mm. When the operating distance between the Wiegand sensor and the magnet 12 reaches 15 mm, the voltage of the outputted electric signal is not lower than 3 V; when the operating distance between the Wiegand sensor and the magnet 12 reaches 30 mm, a voltage signal of more than 100 mV can still be outputted.

Figure 4:
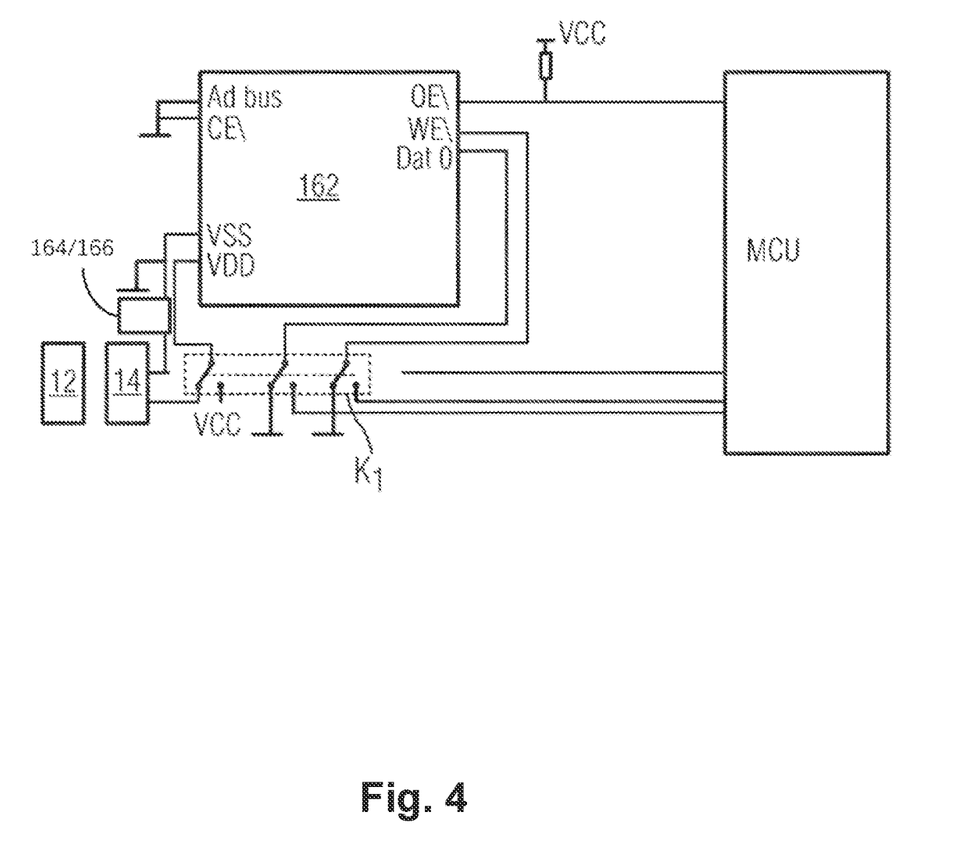
FIG. 4 shows a partial circuit diagram of an electronic sealing label device according to an embodiment of the present invention.

In the circuit structure shown in FIG. 4, the control device 20 may for example be an MCU, and the information recording module 16 may for example be a ferroelectric memory 162; the ferroelectric memory 162 changes a sign data bit Dat0 thereof according to a signal in order to record sign information. The ferroelectric memory (FRAM, ferroelectric RAM) is a random access memory, which is capable of performing storage rapidly with a very low electric energy demand, and can operate like RAM, with extremely low read-write power consumption; furthermore, the content of the ferroelectric memory will not be affected by external conditions such as magnetic field factors, can be used like an ordinary ROM memory, and has non-volatile storage characteristics. Taking FIG. 4 as an example, the ferroelectric memory 162 has two states, namely "read" and "write"; the read and write states thereof are controlled by a port WE. A switch K1 is a triple pole double throw switch; when the switch K1 is moved to a position 1 (the left-hand side position as shown in FIG. 4), the port WE is grounded, and the ferroelectric memory 162 is in the "write" state; at the same time, a signal generated by the Wiegand sensor 14 can be inputted to an input port VDD of the ferroelectric memory 162, and the ferroelectric memory 162 can change the sign data bit Dat0 thereof according to the received signal in order to record sign information. In one embodiment, an initial setting of the sign data bit Dat0 of the ferroelectric memory 162 is "1", and when the input port VDD receives the signal from the Wiegand sensor 14, the ferroelectric memory 162 changes the sign data bit Dat0 thereof to "0"; when the switch K1 is moved to a position 2 (the right-hand side position as shown in FIG. 4), the port WE is energized, and the ferroelectric memory 162 is in the "read" state, i.e. the MCU can read sign information through the sign data bit Dat0 of the ferroelectric memory 162.

In a preferred embodiment, the signal recording module 16 may further comprise an amplification circuit 164 and/or a filter circuit 166 connected between the sensing element 14 and the ferroelectric memory 162. The signal generated by the sensing element 14 will sometimes suffer interference from other factors, and secondary waves or glitches might occur; in order to eliminate the interference caused by secondary waves and glitches, the amplification circuit 164 and/or a filter circuit 166 can be used. After being amplified and shaped by the amplification circuit 164 and filter circuit 166, the signal becomes an approximately rectangular pulse, and it is thus possible to ensure that what the signal recording module 16 receives is a main signal of the sensing element 14, thereby enhancing the ability of the electronic sealing label device 10 to withstand interference.

Figure 2:
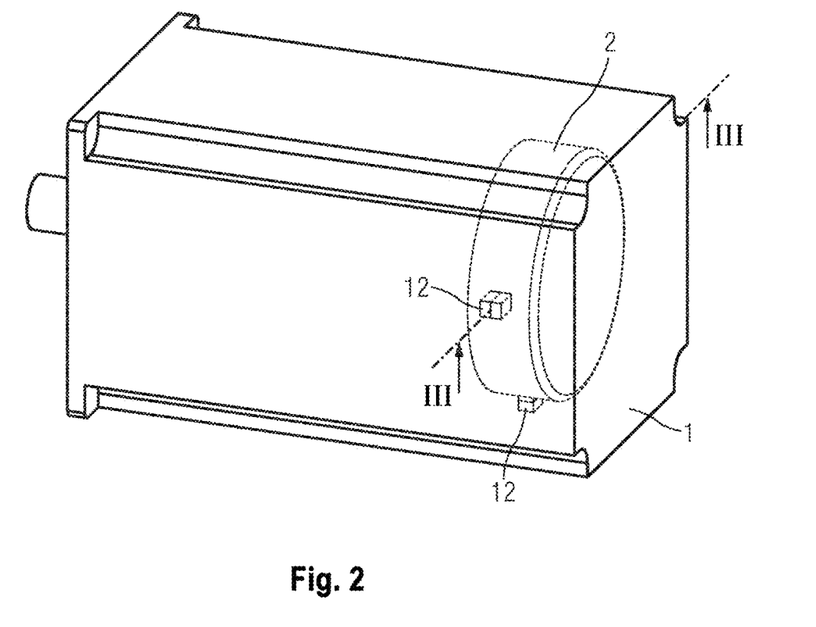
FIG. 2 shows a schematic diagram of an electric machine assembly according to an embodiment of the present invention.
Figure 3:
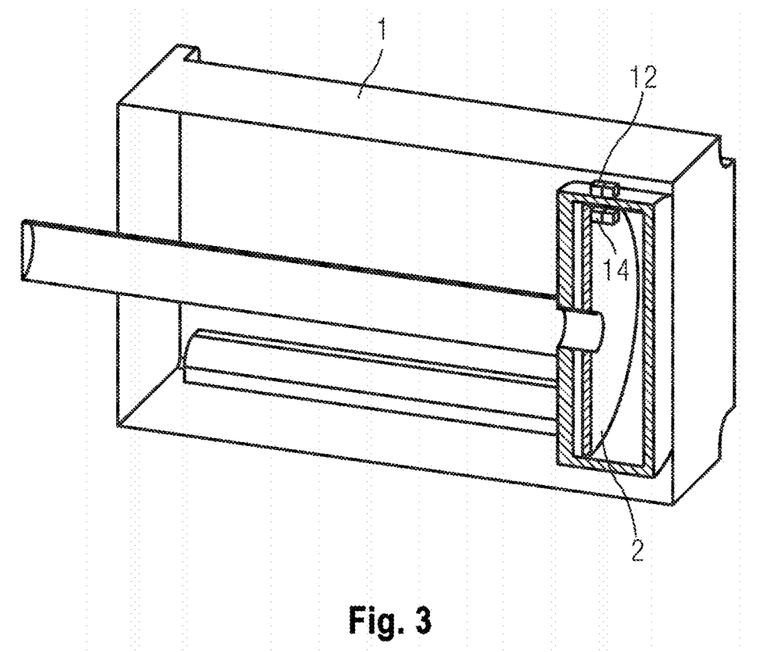
FIG. 3 shows a sectional view in the direction of line III-III in FIG. 2.

An embodiment of an electric machine assembly provided in the present invention is discussed in greater detail in conjunction with FIGS. 2 and 3. In FIGS. 2 and 3, an encoder 2 is a precision measurement apparatus, arranged in an electric machine housing 1, wherein the encoder 2 can be installed by being connected to a shaft of the electric machine; the encoder is a sensor that measures mechanical displacement, by converting an angular displacement of mechanical rotation or linear displacement to an electric signal. If a non-professional disassembles or dismantles the encoder, this will result in a drop in the accuracy of compensation of electric machine torque disturbance during electric machine operation, in turn leading to a fall in electric machine performance.

The electronic sealing label device 10 formed by the abovementioned magnet 12 and sensing element 14 is particularly suited to the anti-dismantling application scenario of the electric machine housing 1 and encoder 2, where the separation is small and the internal installation space is limited. Specifically, the present invention provides an electric machine assembly; taking FIG. 2 as an example, the electric machine assembly comprises the electric machine housing 1, the encoder 2 and the electronic sealing label device 10. The encoder 2 is arranged in the electric machine housing 1; the electronic sealing label device 10 comprises the magnet 12 arranged in the electric machine housing 1 and the sensing element 14 arranged on the encoder 2. The relative positions of the sensing element 14 and the magnet 12 are fixed; when relative movement occurs between the electric machine housing 1 and the encoder 2, the sensing element 14 generates a signal, and it is thereby possible to automatically detect whether the encoder 2 has been moved. In the electric machine assembly, the electronic sealing label device 10 may comprise the signal recording module 16 for generating and recording sign information; the signal recording module 16 is arranged in the encoder 2. The electric machine assembly may further comprise a control device 20; the control device 20 is also arranged on the encoder 2, and the control device 20 generates disassembly/assembly state information of the encoder 2 according to sign information recorded in the signal recording module 16. In addition, in one embodiment, the electric machine assembly may further comprise a driver 3; the driver 3 controls the startup/shutdown of an electric machine in the electric machine assembly according to the disassembly/assembly state information of the control device 20, thereby ensuring that when the driver 3 drives the electric machine to operate, the electric machine and the encoder 2 both remain in the correct installation positions.

Under the action of external forces, the encoder 2 might rotate around an axis, and might also experience displacement in the axial direction of the electric machine. When installation is carried out, any number of magnets 12 can be arranged on the electric machine housing 1 in any way, and the sensing element 14 is arranged in the encoder 2, with the number and position(s) of the sensing element(s) 14 corresponding to the magnet(s) 12; it is thus possible to ensure that when the encoder 2 rotates or moves, the sensing element 14 outputs an electric signal pulse. The positions in which the magnet 12 and the sensing element 14 are arranged can be optimized for the disassembly/assembly characteristics of the encoder 2, to ensure that any dismantling action will cause the sensing element 14 to generate a signal, thus improving the precision of detection. In one embodiment, the electronic sealing label device 10 comprises one magnet 12 and one sensing element 14; the magnet 12 is installed on the electric machine housing 1 in an axial 45-degree direction of the electric machine housing 1; one sensing element 14, arranged in a direction corresponding to the magnet 12, is provided inside the encoder 2. Alternatively, in another embodiment, the electronic sealing label device 10 comprises two magnets 12, the two magnets 12 being installed on the electric machine housing 1 in two directions, specifically axial and radial directions of the electric machine housing 1 respectively; and two sensing elements 14, arranged in directions corresponding to the two magnets 12 respectively, are provided inside the encoder 2.

Figure 5:
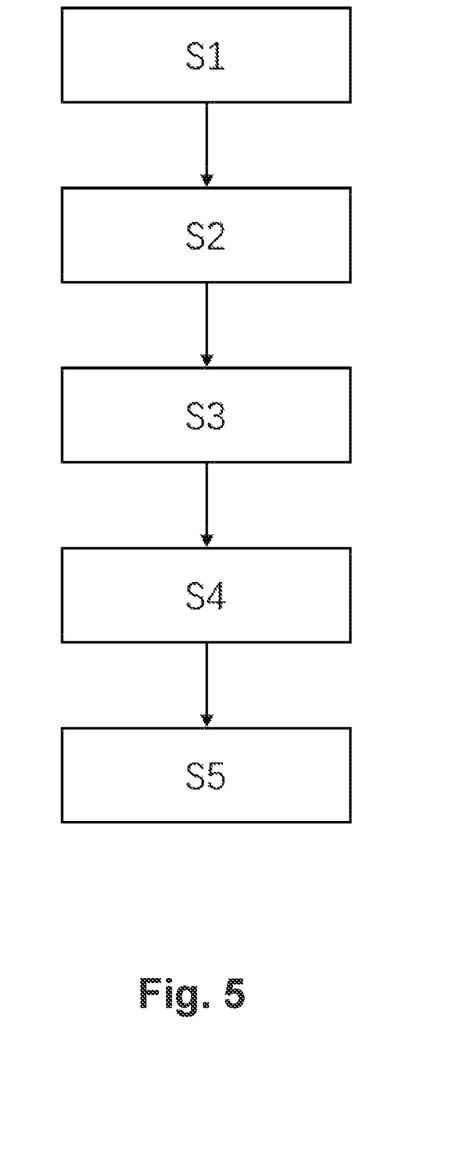
FIG. 5 shows a flow chart of an electronic sealing label verification method according to an embodiment of the present invention.

FIG. 5 shows schematically a flow chart of an electronic sealing label verification method according to an embodiment of the present invention. In this embodiment, the electronic sealing label verification method mainly comprises three steps, S1-S3. Step S1: when an assembly is started, reading sign information in the signal recording module, wherein, when relative movement occurs between the first component and second component, the electronic sealing label device exploits the Wiegand effect to generate a signal, and changes the sign information in the signal recording module according to the signal; step S2: determining whether the first component and second component have been removed according to the sign information; and step S3: if it is determined that removal has occurred, stopping the operation of the first component and/or second component. In a preferred embodiment, if the first component and second component have been removed from each other, then at the same time as the stopping of operation of the first component and/or second component is controlled, it is also possible to generate an alarm signal to issue a warning prompt to a user, to improve system security.

In one embodiment, in order to further realize automated control, after the step of stopping the operation of the first component and/or second component, the method further comprises: step S4: resetting the sign information in the signal recording module; and step S5: when restarting the assembly, performing steps S1-S3 again, wherein step S4 is performed after reassembling and configuring the first component and second component. Each time installation is carried out, an initialization operation of the electronic sealing label device can be automatically realized, to improve efficiency. In one particular embodiment, the first component is the electric machine and the second component is the encoder 2, and the information recording module 16 of the electronic sealing label device is initialized after each installation of the encoder 2; for example, the sign data bit Dat0 of the ferroelectric memory 162 is restored to the initial set value "1", and in step S3, if it is determined that the first component and second component have been removed, operation of the electric machine is stopped.

It will be obvious to those skilled in the art that various amendments and alterations could be made to the above example embodiments of the present invention without deviating from the spirit and scope of the present invention. Thus, it is intended that the present invention should cover amendments and alterations to the present invention that fall within the scope of the attached claims and their equivalent technical solutions.

The invention claimed is:

1. An electronic sealing label device, suitable for detecting a disassembly/assembly state between a first component and a second component, removable from each other, the electronic sealing label device comprising:
   a magnet, arranged on the first component;
   a sensing element, arranged inside the second component and within the first component, the sensing element being fixed in a position opposite the magnet, the sensing element being configured to exploit a Wiegand effect to generate a signal upon relative movement occurring between the first component and second component; and
   a recording module, arranged in the second component, and adapted to receive the signal, and adapted to generate and record sign information according to the signal.

2. The electronic sealing label device of claim 1, wherein the sensing element is an inductive coil, and the signal is an electric signal pulse.

3. The electronic sealing label device of claim 2, wherein a distance between the sensing element and the magnet is less than or equal to a set distance.

4. The electronic sealing label device of claim 1, wherein the sensing element is a Wiegand sensor.

5. The electronic sealing label device of claim 1, wherein a distance between the sensing element and the magnet is less than or equal to a set distance.

6. The electronic sealing label device of claim 1, wherein the recording module comprises:
   a ferroelectric memory, configured to change a sign data bit of the ferroelectric memory according to the signal, in order to record the sign information.

7. The electronic sealing label device of claim 6, wherein the recording module further comprises:
   at least one of an amplification circuit and a filter circuit, connected between the sensing element and the ferroelectric memory.

8. The electronic sealing label device of claim 1, further comprising:
   a control device arranged on the second component, the control device being configured generate disassembly/assembly state information of the second component according to the generated the signal.

9. An electric machine assembly, comprising:
   an electric machine housing;
   a rotatable encoder, the rotatable encoder being arranged in the electric machine housing; and
   an electronic sealing label device, including:
      a magnet, arranged within the electric machine housing;
      a sensing element, the sensing element being arranged in the rotatable encoder and fixed in a position opposite the magnet, the sensing element being configured to exploit a Wiegand effect to generate a signal upon relative movement occurring between the electric machine housing and the rotatable encoder; and
   a driver, to control startup/shutdown of an electric machine in the electric machine assembly according to disassembly/assembly state information of a control device.

10. The electric machine assembly of claim 9, wherein the electronic sealing label device comprises:
   a recording module, adapted to receive the signal, and generate and record sign information according to the signal, wherein the recording module is arranged on the rotatable encoder.

11. The electric machine assembly of claim 10, further comprising:
   the control device, arranged on the rotatable encoder, to generate disassembly/assembly state information of the encoder according to the sign information.

12. The electric machine assembly of claim 9, wherein the electronic sealing label device comprises two magnets, installed on the electric machine housing in axial and radial directions of the electric machine housing respectively; and two sensing elements, arranged in directions corresponding to the two magnets respectively, provided inside the rotatable encoder.

13. The electric machine assembly of claim 9, wherein the electronic sealing label device comprises one magnet and one sensing element; the magnet is installed on the electric machine housing in an axial 45-degree direction of the electric machine housing; and one sensing element, arranged in a direction corresponding to the magnet, provided inside the rotatable encoder.

14. An electronic sealing label verification method, suitable for an assembly including an electronic sealing label device and a first component and a second component, removable from each other, the method comprising:
   reading, upon the assembly being started, sign information from a sensing element arranged inside the second component and recording the sign information in a recording module, wherein, upon relative movement occurring between the first component and second component, the electronic sealing label device exploits a Wiegand effect to generate a signal, and changes the sign information in the recording module according to the signal;
   determining whether the first component and second component have been removed according to the sign information; and
   stopping, upon the determining indicating that removal has occurred, operation of at least one of the first component and the second component.

15. The electronic sealing label verification method of claim 14, wherein, after the stopping of the operation of at least one of the first component and the second component, the method further comprises:
   resetting the sign information in the recording module; and
   performing, upon restarting the assembly, the reading, determining and stopping again, wherein the resetting is performed after reassembling and configuring the first component and second component.

16. The electronic sealing label verification method of claim 14, wherein the stopping further comprises:
   generating an alarm signal at a same time as the stopping of the operation of at least one of the first component and the second component.

17. The electronic sealing label verification method of claim 14, wherein the first component is an electric machine and the second component is an encoder, wherein the stopping further comprises:

only stopping, upon the determining indicating that removal has occurred, the operation of the electric machine.

* * * * *